United States Patent
Litman et al.

(10) Patent No.: US 7,430,104 B2
(45) Date of Patent: Sep. 30, 2008

(54) ELECTROSTATIC CHUCK FOR WAFER METROLOGY AND INSPECTION EQUIPMENT

(75) Inventors: Alon Litman, Nes Ziona (IL); Igor Krivts, Rehovot (IL)

(73) Assignee: Appiled Materials, Inc., Santa Clara, CA (US)

( * ) Notice: Subject to any disclaimer, the term of this patent is extended or adjusted under 35 U.S.C. 154(b) by 423 days.

(21) Appl. No.: 10/449,539

(22) Filed: May 29, 2003

(65) Prior Publication Data

US 2004/0179323 A1  Sep. 16, 2004

Related U.S. Application Data

(60) Provisional application No. 60/454,049, filed on Mar. 11, 2003.

(51) Int. Cl.
*H01L 21/683* (2006.01)
*H05F 3/00* (2006.01)

(52) U.S. Cl. .................. 361/234; 361/233; 279/218

(58) Field of Classification Search ........... 361/233, 361/234; 307/147; 279/128

See application file for complete search history.

(56) References Cited

U.S. PATENT DOCUMENTS

| | | | |
|---|---|---|---|
| 3,916,270 A | 10/1975 | Wachtler et al. | |
| 3,983,401 A | 9/1976 | Livesay | |
| 3,993,509 A | 11/1976 | McGinty | |
| 4,184,188 A | 1/1980 | Briglia | |
| 4,356,384 A * | 10/1982 | Gat | 392/418 |
| 4,384,918 A | 5/1983 | Abe | |
| 4,692,836 A | 9/1987 | Suzuki | |
| 4,724,510 A | 2/1988 | Wicker et al. | |
| 5,103,367 A | 4/1992 | Horwitz et al. | |
| 5,117,121 A | 5/1992 | Watanabe et al. | |
| 5,561,585 A * | 10/1996 | Barnes et al. | 361/234 |
| 5,946,184 A * | 8/1999 | Kanno et al. | 361/234 |
| 6,305,677 B1 * | 10/2001 | Lenz | 269/13 |
| 6,370,004 B1 * | 4/2002 | Yamaguchi | 361/234 |
| 6,500,686 B2 * | 12/2002 | Katata et al. | 438/22 |
| 6,639,783 B1 * | 10/2003 | Shamouilian et al. | 361/234 |
| 6,760,214 B2 * | 7/2004 | Tomaru et al. | 361/234 |
| 6,780,278 B2 * | 8/2004 | Hayashi et al. | 156/345.47 |
| 6,831,823 B2 * | 12/2004 | Ishida | 361/234 |
| 6,888,106 B2 * | 5/2005 | Hiramatsu | 219/444.1 |
| 6,898,064 B1 * | 5/2005 | Berman et al. | 361/234 |
| 2001/0019472 A1 | 9/2001 | Kanno et al. | |
| 2003/0043530 A1 | 3/2003 | Kwon et al. | |
| 2003/0082466 A1 * | 5/2003 | del Puerto et al. | 430/22 |
| 2003/0132218 A1 * | 7/2003 | Hiramatsu et al. | 219/444.1 |

FOREIGN PATENT DOCUMENTS

EP     0 783 175     7/1997

OTHER PUBLICATIONS

Hayashi et al.☐☐Plasma Processing Apparatus with Reduced Parasitic Capacity and Loss in RF Power☐☐Filed: Jun. 28, 2001☐☐US Patent Application Publication.*
Ceramaret Alumina (Al2O3)—Physical, Mechanical, Thermal, Electrical & Chemical Properties 2000-2007 http://www.azom.com/details.asp?ArticleID=3382.*
Accuratus Materials—Aluminum Oxide (Al2O3) Properties 2002 http://www.accuratus.com/alumox.html.*
Patent Cooperation Treaty, PCT International Search Report, International application No. PCT/US2004/007588, International filing date Mar. 11, 2004, 4pgs.

* cited by examiner

*Primary Examiner*—Zeev Kitov
(74) *Attorney, Agent, or Firm*—Tarek N. Fahmi

(57) ABSTRACT

An electrostatic chuck is configured for electrostatically securing a wafer while limiting charge on the wafer and physical contact between the electrostatic chuck and the wafer. The electrostatic chuck has a pair of electrodes and at least one support pin electrically isolated from the electrodes. The top portion of the support pin protrudes above the top surface of the electrodes. The support pin can be such that the top portion of the support pin is adjustable with respect to the top surfaces of the electrodes.

26 Claims, 5 Drawing Sheets

ELECTROSTATIC CHUCK FOR WAFER METROLOGY AND INSPECTION EQUIPMENT

RELATED APPLICATIONS

This application claims the benefit of U.S. Provisional Application No. 60/454,049, titled "Electrostatic Chuck Wafer Metrology and Inspection Equipment" filed Mar. 11, 2003.

FIELD OF THE INVENTION

The present invention relates to the field of wafer metrology. More specifically, the invention relates to an electrostatic chuck for securing a wafer while minimizing physical contact with the wafer.

BACKGROUND

In recent years, the use of electrostatic chucks in the semiconductor industry has increased because these chucks exhibit excellent characteristics in a vacuum. In addition, electrostatic chucks have several advantages over mechanical and vacuum chucks. For example, electrostatic chucks reduce stress-induced cracks caused by mechanical clamps, allow processing of a larger portion of the wafer, and can be used in processes conducted at low pressure.

A typical monopolar electrostatic chuck is made up of an electrode covered by a dielectric. When the electrode is electrically charged, an opposing electrostatic charge accumulates in the wafer and the resultant electrostatic force holds the wafer on to the electrostatic chuck.

The original concept for a monopolar electrostatic chuck was described by G. Wardly, "Electrostatic Wafer Chuck for Electron Beam Microfabrication," Rev. Sci. Instr. 44, 1506 (1973). A wafer, acting as one plate of a capacitor, is placed on a metal chuck covered with a dielectric that acts as the other plate of the capacitor. It is well known there is a strong attractive force between the two plates of a capacitor when they are held at different potentials. Consequently, the wafer is attracted to the metal chuck when the wafer is held at one electrical potential while the metal chuck is held at another electric potential. Because the metal chuck is only charged at one potential, this arrangement is referred to as a monopolar electrostatic chuck.

Further developments in monopolar technology have subsequently been described in various issued patents. For example, Livesay (U.S. Pat. No. 3,983,401, Sep. 28, 1976) and McGinty (U.S. Pat. No. 3,993,509, Nov. 23, 1976) describe a monopolar electrostatic chuck configured such that the wafer is supported on a flat pedestal or supported vertically in a wedge configuration, respectively.

However, problems arise in the monopolar configuration because a voltage must be applied to the wafer in order to produce the desired attractive chucking force. This limits the wafers to be held to conductors or semiconductors or at least to be coated with a conducting layer. Consequently, a silicon wafer coated with a layer of oxide ($SiO_2$) cannot be held by a monopolar chuck.

Some of the problems associated with non-conducting wafers were addressed in later patents. For example, Wachtler (U.S. Pat. No. 3,916,270, Oct. 28, 1975), Briglia (U.S. Pat. No. 4,184,188, Jan. 15, 1980) and Wicker (U.S. Pat. No. 4,724,510, Feb. 9, 1988) recognized that it was not necessary to contact the wafer if a split electrode concept was used. That is, when the lower electrode of a capacitor is split into two equal parts and separated by an insulator, with each half placed at equal but opposite voltages (e.g. +V and −V), then the upper electrode (the wafer) must be at ground potential (V=0) because of symmetry. In this case, there is an absolute value potential difference of 'V' between each half of the lower electrode and its respective portion of the upper electrode (the wafer). The attractive force between two plates of a capacitor depends on the voltage difference squared, so there are equal holding forces on each wafer half. Most importantly, it is not necessary to make contact with the wafer surface in order to maintain the preferred wafer voltage (preferably zero). Because the lower electrode of the capacitor is split into two equal parts with each half placed at equal but opposite voltages, this arrangement is referred to as a bipolar electrostatic chuck.

However, Wachtler, Briglia and Wicker's electrode geometries are fairly difficult to fabricate. Abe (U.S. Pat. No. 4,384,918 May 24, 1983) described a simpler arrangement wherein each electrode is a simple half circle. Nevertheless, fabricating such a bipolar chuck presents many practical difficulties. Such difficulties arise because (1), the force of attraction is very sensitive to flatness of the chuck surface and (2), it is difficult to electrically isolate each half electrode.

A further refinement on the bipolar concept was described in Suzuki (U.S. Pat. No. 4,692,836, Sep. 8, 1987). Suzuki pointed out that by using a radially segmented bipolar design, a wafer that is initially bowed up in the center can be more easily flattened by activating the central electrodes first. Unfortunately, practical semiconductor wafers are more likely to be warped rather than simply bowed. Therefore, Suzuki design offers no solution to this problem.

Wafer retention to the chuck is another issue for electrostatic chucks. When a DC voltage is applied, the dielectric separating the wafer and the metal chuck can become permanently polarized and, after the voltage is removed, the residual polarization can hold the wafer to the chuck for some time. Horwitz (U.S. Pat. No. 5,103,367, Apr. 7, 1992) suggested a solution to the problem of wafer retention by describing an AC chuck. Horowitz suggested the use of sapphire or boron nitride as the dielectric material because of the ability of such materials to transfer RF power efficiently. However, Horowitz did not describe any method of fabricating such a chuck. In particular, when two pieces of a single crystal material are joined by a high temperature process, it is important to know whether or not the crystalline material is anisotropic. In other words, when heated, it may expand different amounts in different crystal orientations. In such cases, when the joined parts cool to room temperature, the assembly warps. It should be noted that large diameter discs or wafers of sapphire or boron nitride, as required by the Horowitz technique, are prohibitively expensive. At the same time, AC excitation of an electrostatic chuck introduces many practical difficulties in designing and operating such a system.

Another approach to dealing with the problem of slow wafer release is described in Watanabe (U.S. Pat. No. 5,117,121, May 26, 1992). Watanabe describes a chuck made of ceramic that is inherently susceptible to retention forces. He proposed effecting the release of the wafer by applying a high reverse bias voltage (1.5-2 times). However, this high voltage increases the risk of breakdown of the dielectric and is difficult to control in a practical circuit. For example, if the reverse bias is held too long, the wafer will stick again and not release.

Another issue inherent to current monopolar and bipolar electrostatic chuck designs is particle contamination on the backside of the wafer. The level of backside particulate contamination is a function of the contact area between the wafer and electrostatic chuck, surface finish of the electrostatic chuck contact area, and mechanical stress in the contact points. Particle contamination on the backside of wafers has become a serious issue in advanced microelectronics manufacturing for several reasons. One reason is particles on the backside of the wafer can cause cross-contamination and electrical contact failures in interconnect structures. A second reason is the change in wafer planarity associated with such contamination. Specifically, particles present on the backside of the wafer can impact control over the critical dimension in lithographic processes by causing wafer warpage.

Accordingly, there is a need for a practical, reliable, and less expensive electrostatic chuck for holding and reliably releasing wafers while minimizing backside wafer contamination by limiting wafer contact with the electrostatic chuck.

SUMMARY OF THE INVENTION

An electrostatic chuck is configured to electrostatically secure a wafer while limiting physical contact between the electrostatic chuck and the wafer. In one embodiment of the present invention, the electrostatic chuck has a pair of electrodes and at least one support pin electrically isolated from the electrodes. The top portion of the support pin protrudes above the top surface of the electrodes and each electrode has an electrical connector for connecting to a voltage supply. Thus, when used to support the wafer, the problem of slow wafer release due to sticking is minimized because the bottom surface of the wafer rests upon the top portion of the support pin and not the electrodes. This feature allows for an electrostatic chuck without an isolator near the wafer.

In varying embodiments of the present invention, each electrode can be made up of more than one electrode element and either be electrically isolated from one another and each having an electrical connector, or electrically connected and sharing a common electrical connector. Further, because the support pin is electrically isolated from the electrode, it can be composed of a conducting or non-conducting material or combination thereof.

In some embodiments, the support pin (or pins, if more than one is present) is a piezoelectric actuated pin, such that the height of the top portion of the support pin is adjustable with respect to the top surfaces of the electrodes. In another embodiment, the support pin is coupled to the electrodes.

In one embodiment of the present invention, the electrodes have at least one hole (or holes, if more than one is present) to accommodate a lifting pin (or pins) that is used for transferring semiconductor wafers to other devices. In other embodiments, the lifting pin is coupled to the electrode. In any embodiment, the lifting pin does nor protrude above the top surface of the electrode prior to actuation.

In another embodiment of the present invention, the pair of electrodes is physically coupled to a base plate. In varying embodiments, the base plate can be metallic, comprised of more than one piece, and the pair of electrodes is physically coupled to the base plate by at least one fastener and separated from the base plate by at least one electrically insulated spacer. In yet another embodiment, the base plate can be circular and the electrodes semi-circular.

In one embodiment of the present invention, the base plate has at least one hole to accommodate a lifting pin. In other embodiments, the lifting pin and the support pin are coupled to the base plate and the lifting pin does not protrude above the top surface of the electrode prior to actuation. In some embodiments, the support pin (or pins, if more than one is present) is a piezoelectric actuated pin, such that the height of the top portion of the support pin is adjustable with respect to the top surfaces of the electrodes that are physically coupled to the base plate.

Additional features and advantages of the invention are set forth in the detailed description below. It will be readily apparent to those skilled in the art from the description or recognized by practicing the invention that the foregoing general description and the subsequent detailed description and drawings are merely exemplary of the invention and intended to provide a framework to understand and implement the invention as claimed.

BRIEF DESCRIPTION OF THE DRAWINGS

The present invention is illustrated by way of example, and not limitation, in the figures of the accompanying drawings, which illustrate various embodiments of the present invention.

DETAILED DESCRIPTION

The present invention provides an improved electrostatic chuck for wafer metrology and inspection equipment. This electrostatic chuck provides a method of reducing the number of particles on the backside of wafers during metrology and inspection processing. In addition, this device prevents the charge of the wafer that eliminates some kinds of dechucking problems. In one embodiment of the present invention, piezoelectric support pins allow for wafer adjustment to reach wafer surface planarity. This is a particular concern in machines designed to process 200 mm and 300 mm wafers. During metrology and inspection processing the wafer is located on these support pins and electrostatic force holds the wafer onto the electrostatic chuck.

Figure 1:
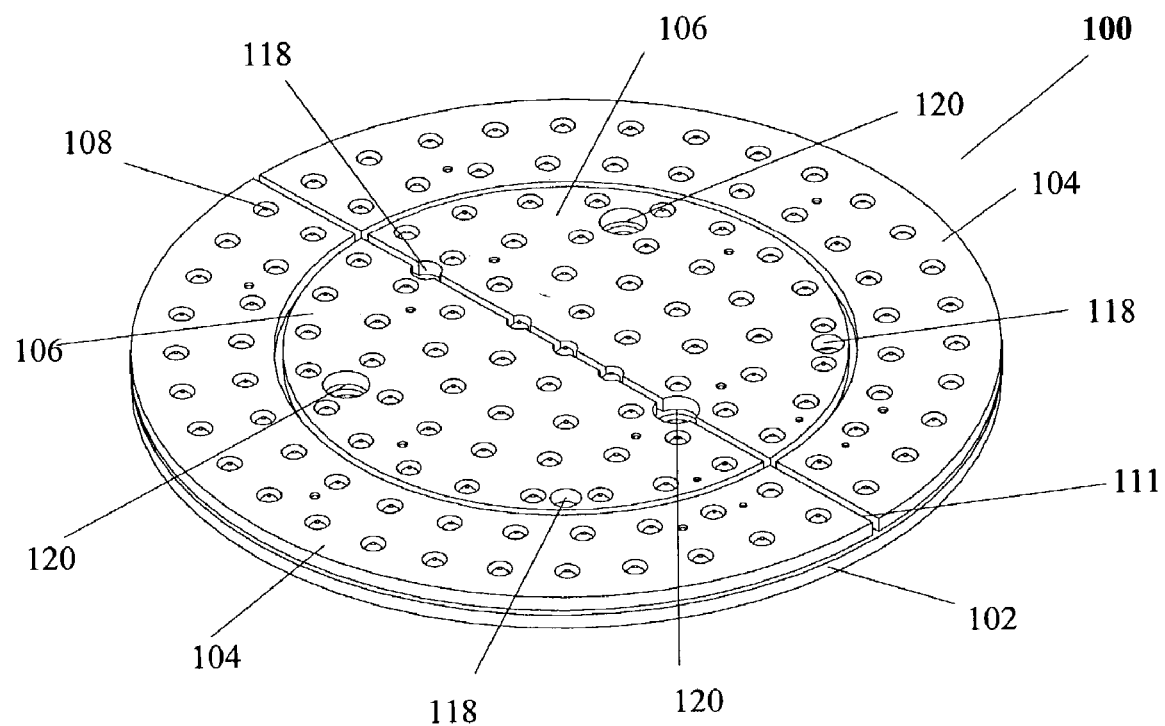
FIG. 1 is a top isometric view of one embodiment of an electrostatic chuck configured in accordance with the present invention.

In FIGS. 1 through 5 are shown an embodiment of the present invention for the electrostatic chuck with non-adjustable support pins. FIG. 1 is a top isometric view substantially similar to that of FIG. 3 (the top plan view), of one embodiment of an electrostatic chuck configured in accordance with the present invention. Electrostatic chuck 100 includes a circular base (102), which has a semi-circular electrode pair (106) for 200 mm and 300 mm wafers, and an additional semi-circular electrode pair (104) for 300 mm wafers. The support pins (108) are shown as built-in elements and distributed throughout the electrode surfaces (104 and 106). The base (102) and electrodes (104 and 106) have holes (118) for lifting pins (not shown) used to transfer the wafer to another device. Three additional holes (120) are used for the installation of the electrostatic chuck on the positioning stage (not shown).

Figure 4:
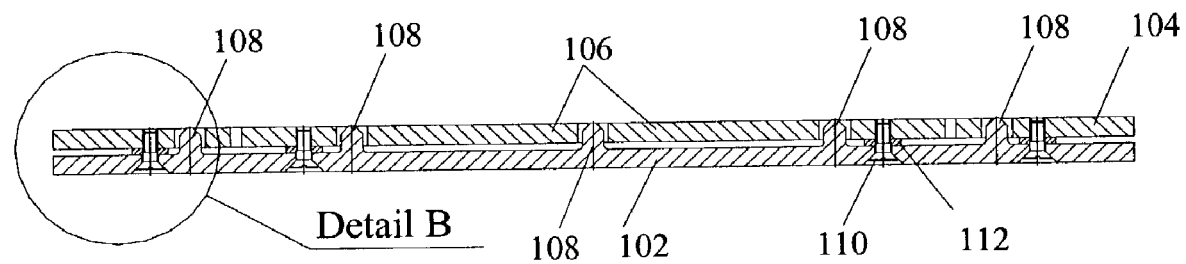
FIG. 4 is the cross-section A-A view from FIG. 3 of the electrostatic chuck.

The electrodes (104 and 106) are affixed to the top surface of base (102) by fasteners and separated from the base by spacers, such as the screws (110) and spacers (112) shown in FIG. 4. Each electrode pair (104 and 106) has symmetry with respect to the center axis (111), which represents the dividing line between opposing electrode voltages. The symmetry provides an even distribution of electrostatic force as applied to the wafer.

Figure 2:
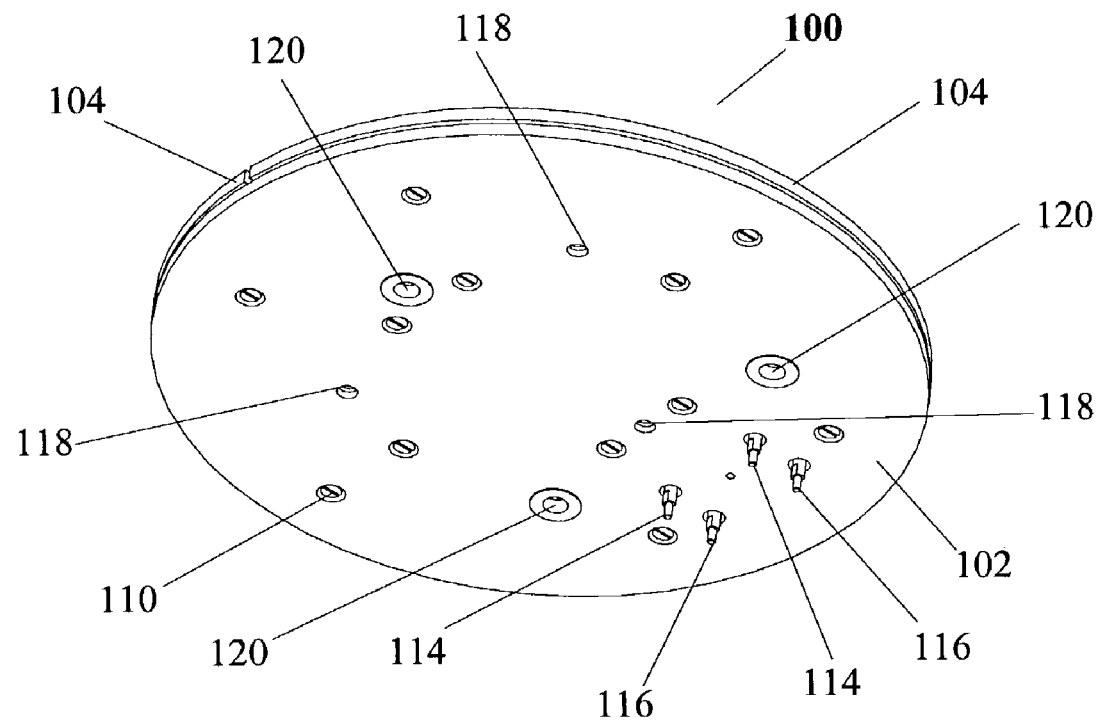
FIG. 2 is a bottom isometric view of one embodiment of an electrostatic chuck configured in accordance with the present invention.

FIG. 2 is a bottom isometric view of one embodiment of an electrostatic chuck configured in accordance with the present invention. FIG. 2 illustrates, among other things, the circular base (102), the fasteners (110), and the electrical connectors (114 and 116) of each pair of electrodes (104 and 106). Each electrode pair (104 and 106) has a corresponding pair of electrical connectors (114 and 116) associated with each one of the electrodes. For example, the electrode pair for 200 mm wafers (106) has two corresponding electrical connectors (114) and the electrode pair for 300 mm wafers (104) also has two corresponding electrical connectors (116). In other embodiments of the present invention, each electrode pair (104 and 106) can consist of multiple elements each having an electrical connector so long as the symmetry with respect to center axis (111) is maintained.

In one embodiment of the present invention, to minimize the physical contact area between the wafer and electrostatic chuck, the support pins (108) have a conical shape that includes a highly flat top surface where the pin contacts the wafer. In varying embodiments, the support pins (108) can be made out of various materials known in the art, such as various types of conductors or insulators.

Figure 3:
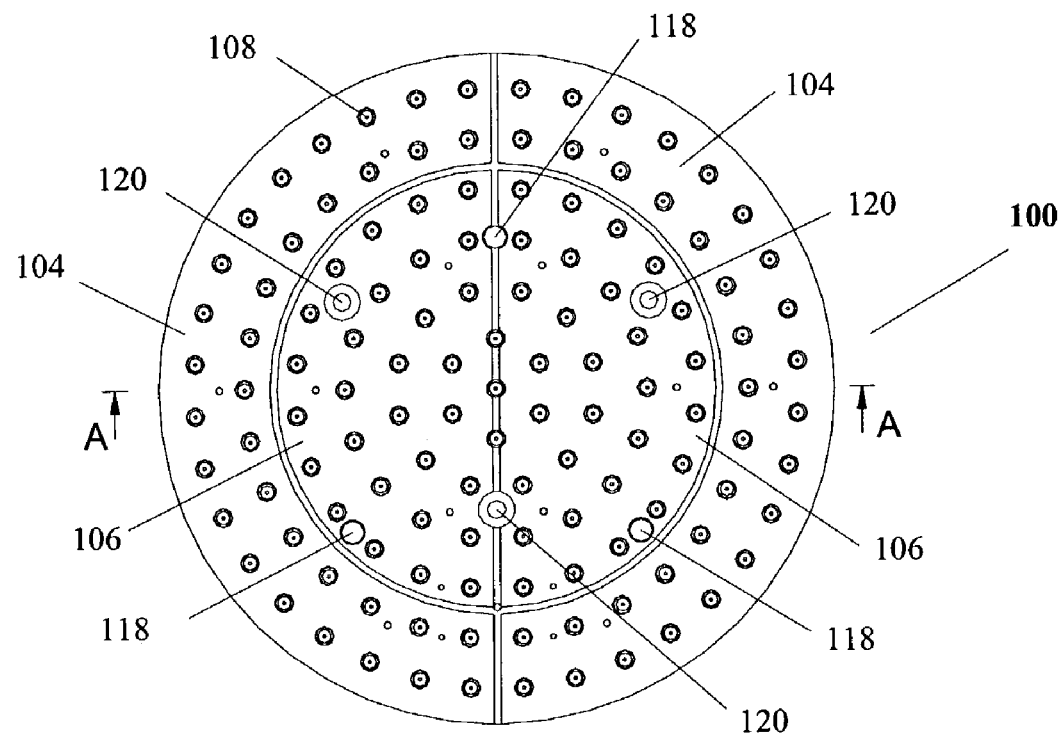
FIG. 3 is a top plan view of one embodiment of an electrostatic chuck configured in accordance with the present invention.

FIG. 4 is the cross-section A-A view from FIG. 3 of one embodiment of the electrostatic chuck. As illustrated in FIG. 4, this exemplary embodiment includes support pins (108) (not all shown from FIG. 3) and fasteners (110) and spacers (112) connecting the electrodes (104 and 106) to the base plate (102). As shown, this embodiment of the present invention includes support pins (108) as built in elements of base plate (102). In another embodiment, the support pins (108) are built into and electrically isolated from the electrodes (104 and 106).

Figure 5:
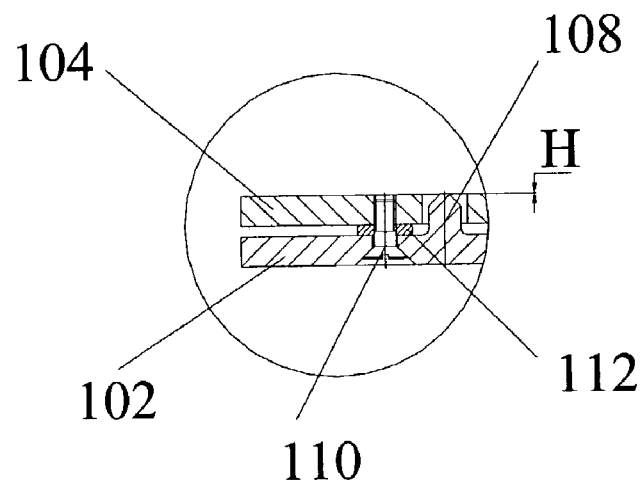
FIG. 5 is the detail B view from FIG. 4 of the support pin and connecting of the base and electrode.

FIG. 5 is the detail B view from FIG. 4 of a support pin (108) and a fastener (110) and spacer (112) connecting the electrode (104) to the base plate (102). In one embodiment of the present invention, the base plate (102) and electrodes (104 and 106) are assembled with fasteners (110) and spacers (112) (see also FIG. 4). In various embodiments, the combination of materials making up the base plate (102), the fasteners (110) and spacers (112) can vary so long as the combination preserves the electrical isolation between the opposing electrodes. For example, the fasteners (110) and spacers (112) can be made from an electrically insulating material of high dielectric strength and surface resistivity, such as "Erta Peek" (Polyetheretherketone) and the base plate (102) and pins (108) from ceramic. Electrodes (104 and 106) can be made from aluminum alloy, for example AA6061 or AA7075, and protected by synergistic coating, such as "Tufram" by General Magnaplate Corporation. In another embodiment, the electrodes (104 and 106) can be made without an isolation coating.

In an exemplary embodiment of the present invention, the gap "H" (see FIG. 5) between the upper surfaces of the support pins (108) and electrodes (104 and 106) is 0.05±0.01 mm. The gap "H" is determined by thickness of spacers (112) that separate the base plate (102) from electrodes (104 and 106). The gap "H" prevents the charge of the wafer and minimizes the parasite chucking force helping to eliminate various kinds of dechucking problems. The aforementioned chucking force is the electrostatic force between the wafer and electrodes (104 and 106) across the gap "H".

Figure 6:
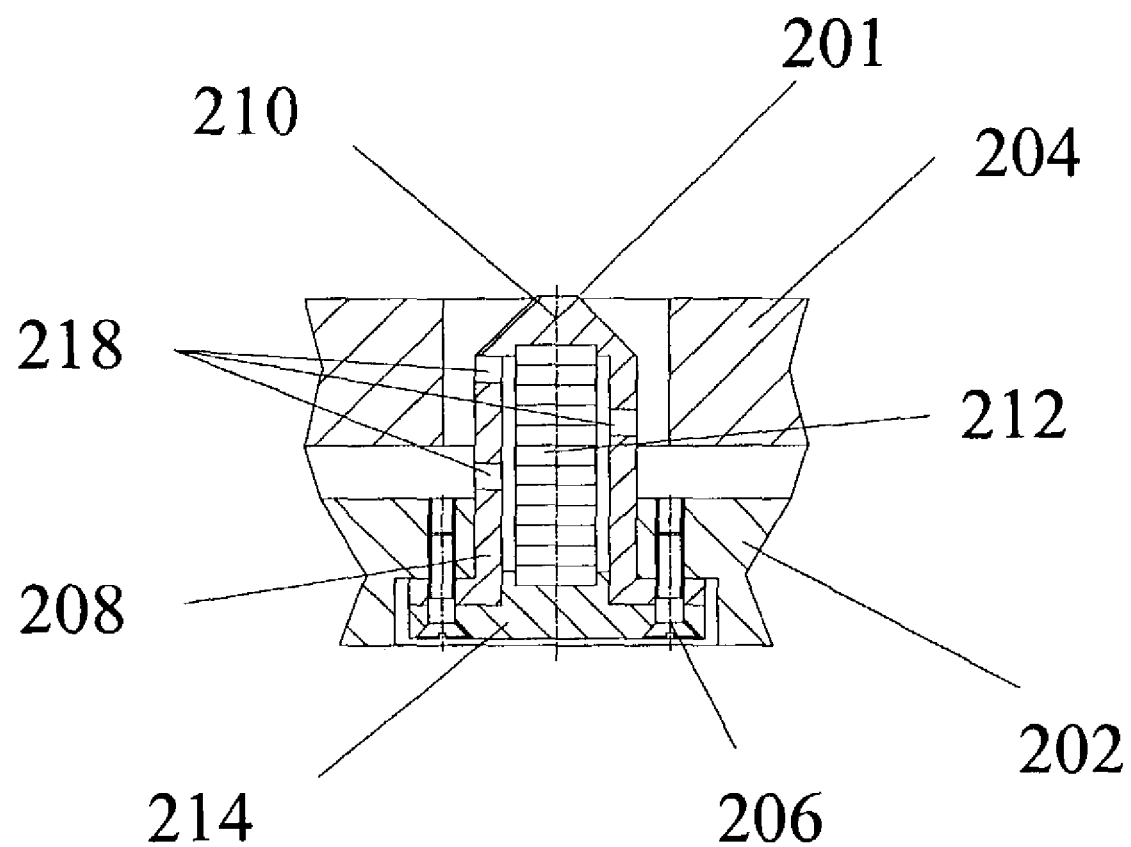
FIG. 6 is a cross-sectional view of an the support pin with a piezoelectric actuator.
Figure 7:
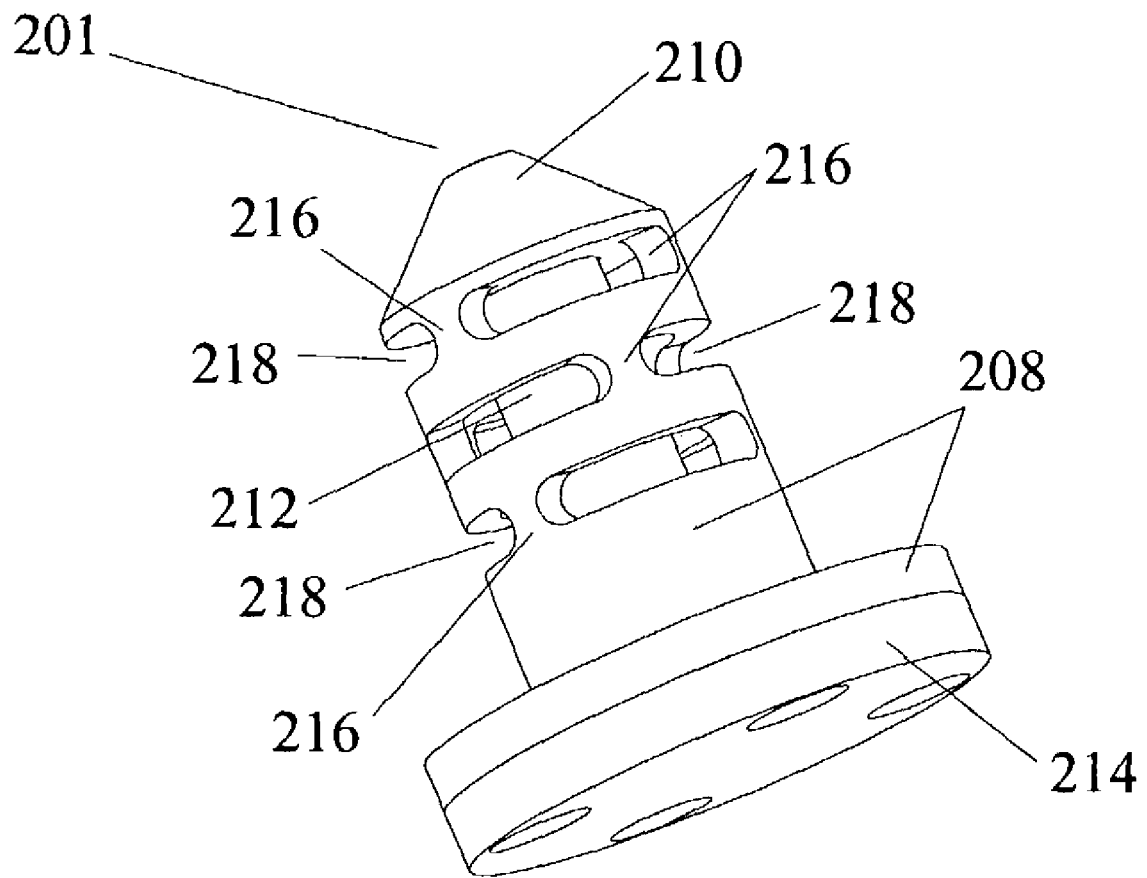
FIG. 7 is an isometric view of an embodiment the support pin with a piezoelectric actuator

In FIG. 6 and FIG. 7 are shown a further embodiment of the present invention for the electrostatic chuck with adjustable support pins. In one embodiment the support pins are of a piezoelectric material. A piezoelectric material is any material that mechanically deforms to an application of an external electric field.

FIG. 6 shows a support pin (201) as incorporated into a base plate (202) and electrode (204), while FIG. 7 illustrates a detailed isolated view of support pin (201). As illustrated in FIGS. 6 and 7, one embodiment of the electrostatic chuck includes a base plate (202) and an electrode (204). The adjustable support pin (201) has been attached to the base (202) through the use of fasteners (206). Each adjustable support pin (201) has the base of the piezoelectric actuator (214), the piezoelectric actuator (212), and the body of the support pin (201), which includes the base (208), head (210), and flexure spring member (mechanism incorporated into body). The flexure spring member has three rows of walls (216) and slots (218). The piezoelectric-actuator (214) is within the adjustable support pin (201) between the base (214) and head (210).

This structure has high rigidity to radial (horizontal) direction and low rigidity to axial (vertical) direction. The flexure spring mechanism responds to a force applied in the axial plane to move the head (210) of support pin (201) along the vertical axis. The force applied to the axial plane is supplied by the application of an electric field to the piezoelectric actuator (212). Moving the head (210) within the axial plane allows the wafer to be adjusted to reach wafer surface planarity. In other embodiments of the present invention the head (210) of support pin (201) is adjustable along the vertical axis by other mechanical methods, such as a pneumatic or hydraulic actuator.

In the foregoing specification, the invention has been described with reference to specific embodiments. It will, however, be evident that various modifications and changes can be made without departing from the broader spirit and scope of the invention as set forth in the appended claims. The specification and drawings are, accordingly, to be regarded in an illustrative rather than a restrictive sense.

An electrostatic chuck is configured for electrostatically securing a wafer while limiting charge on the wafer and physical contact between the electrostatic chuck and the wafer. The electrostatic chuck has a pair of electrodes and at least one support pin electronically isolated from the electrodes. The top portion of the support pin protrudes above the top surface of the electrodes. The support pin can be such that the top portion of the support pin is adjustable with respect to the top surfaces of the electrodes.

What is claimed is:

1. An electrostatic chuck, comprising:
   a pair of electrodes each having a top surface, each of the electrodes including at least one hole to accommodate a lifting pin; and
   a plurality of support pins electrically isolated from the electrodes, a top portion of each of the plurality of support pins protruding above the top surfaces of the electrodes through holes separate from the at least one hole in each electrode to accommodate a lifting pin, and configured to support a wafer a distance above the top surfaces of the electrodes such that the wafer rests upon the top surfaces of the support pins and not the electrodes while the wafer is undergoing inspection or metrology.

2. The electrostatic chuck of claim 1 wherein the pair of electrodes is physically coupled to a base plate.

3. The electrostatic chuck of claim 2 wherein the base plate is metallic.

4. The electrostatic chuck of claim 2 wherein the base plate is comprised of more than one piece.

5. The electrostatic chuck of claim 2 wherein the pair of electrodes is physically coupled to the base plate by at least one fastener.

6. The electrostatic chuck of claim 2 wherein the pair of electrodes is separated from the base plate by at least one electrically insulated spacer.

7. The electrostatic chuck of claim 2 wherein the base plate is circular and the electrodes are semi-circular.

8. The electrostatic chuck of claim 1 wherein each electrode has an electrical connector.

9. The electrostatic chuck of claim 1 wherein each electrode is comprised of more than one electrode element.

10. The electrostatic chuck of claim 9 wherein each of the electrode elements is electrically isolated.

11. The electrostatic chuck of claim 9 wherein each of the electrode elements has an electrical connector.

12. The electrostatic chuck of claim 9 wherein each of the electrode elements is electrically connected.

13. The electrostatic chuck of claim 1 wherein the pair of electrodes is made from a highly conductive material without an isolation coating.

14. The electrostatic chuck of claim 1 wherein the lifting pin is coupled to the electrode, the lifting pin recessed below the electrode top surface prior to actuation.

15. The electrostatic chuck of claim 2 wherein the base plate includes at least one hole to accommodate the lifting pin.

16. The electrostatic chuck of claim 2 wherein the lifting pin is coupled to the base plate, and is recessed below the electrode top surface prior to actuation.

17. The electrostatic chuck of claim 1 wherein the support pin is composed of a conducting material.

18. The electrostatic chuck of claim 1 wherein the support pin is coupled to the electrode.

19. The electrostatic chuck of claim 2 wherein the support pin is coupled to the base plate.

20. The electrostatic chuck of claim 1 wherein the top portion of the support pin being adjustable with respect to the top surfaces of the electrodes.

21. The electrostatic chuck of claim 20 wherein the support pin is coupled to the electrodes.

22. The electrostatic chuck of claim 20 wherein the support pin is a piezoelectric actuated pin.

23. The electrostatic chuck of claim 2 wherein the top portion of the support pin is adjustable with respect to the top surfaces of the electrodes.

24. The electrostatic chuck of claim 23 wherein the support pin is a piezoelectric actuated pin.

25. The electrostatic chuck of claim 23 wherein the support pin is coupled to the base plate.

26. The electrostatic chuck of claim 1 wherein the top surfaces of the electrodes are not insulated.

\* \* \* \* \*